United States Patent [19]
Griffin et al.

[11] Patent Number: 4,641,082
[45] Date of Patent: Feb. 3, 1987

[54] SIX-PORT REFLECTOMETER

[75] Inventors: Eric J. Griffin, Malvern; Richard J. Collier, Canterbury; George Hjipieris, Stevenage, all of England

[73] Assignee: The Secretary of State for Defence in Her Britannic Majesty's Government of the United Kingdom of Great Britain and Northern Ireland, London, England

[21] Appl. No.: 727,227

[22] Filed: Apr. 25, 1985

[30] Foreign Application Priority Data

May 24, 1984 [GB] United Kingdom ............... 8413339

[51] Int. Cl.$^4$ ............................................ G01R 27/06
[52] U.S. Cl. .................................. 324/58 B; 333/109; 333/114
[58] Field of Search ............... 333/109, 112, 114–116; 324/58 B

[56] References Cited

U.S. PATENT DOCUMENTS 4,489,271 12/1984 Riblet ............................ 333/114 X
4,571,545 2/1986 Griffin et al. .................... 333/109 X

FOREIGN PATENT DOCUMENTS 3111204 9/1982 Fed. Rep. of Germany .
864860 4/1961 United Kingdom .

OTHER PUBLICATIONS

Engen, *The Six-Port Reflectometer: An Alternative Network Analyzer*, IEEE Trans. on MTT, vol. MTT-25, No. 12, Dec. 1977.
Griffin, *Six-Port Reflectometer Circuit Comprising Three Directional Couplers*, Electronics Letters, 10th Jun. 1982, vol. 18, No. 12, pp. 491-493.

Primary Examiner—Paul Gensler
Attorney, Agent, or Firm—William R. Hinds

[57] ABSTRACT

A six-port reflectometer has first and second directional couplers, a first waveguide and a third directional coupler providing a series connection from a source to a test device. The first coupler is connected to two detectors. The second coupler is connected to a third detector and to a fourth waveguide having two ports connected via a waveguide and a further port connected to an absorber. The third coupler is connected to a detector and a reflector. The second waveguide and the reflector receive radiation coupled by the second and third couplers respectively. The third and fourth couplers provide equivalent transmission paths. Equal path lengths are traversed by signals leaving the second coupler and returning to it from the reflector and the fourth coupler respectively. With broad-band couplers and waveguides, this arrangement gives broad-band performance.

5 Claims, 4 Drawing Figures

SIX-PORT REFLECTOMETER

This invention relates to a six-port reflectometer of the kind employed for measuring the voltage reflection coefficient (VRC) of a load or electronic device under test (DUT) at microwave frequencies.

Six-port reflectometers are known, and comprise a waveguide junction to transmit input radiation from a source for incidence on a reflecting DUT. The power of the source radiation and three different combinations of input and reflected power are respectively detected by four detectors. For the purposes of this specification, the term "input" as applied to radiation will be construed as describing microwaves unreflected by or prior to reflection at a DUT, and the term "reflected" to microwaves after reflection at the DUT. The detectors are connected to four ports of the junction, the two remaining ports being connected to the source and DUT. Three relative power measurements are obtained from the ratios of the detected input/reflected power combinations to the detected input power. The VRC of a DUT is obtained by comparing the corresponding power ratio measurements with those produced by a series of calibration standards having known VRCs.

Specific designs of six-port reflectometers have been published in the technical literature. In IEEE Transactions, MTT-25, pp 1075–1083 (two papers), December 1977 (Reference 1), G. F. Engen analysed reflectometer properties in terms of a diagram of the complex plane displaying an unknown reflection coefficient $\Gamma$ as a radius vector. At respective values of $\Gamma$, each of the three detected power ratios would be zero. These three zero power points were designated by the complex numbers $q_1$, $q_2$ and $q_3$ in the complex plane. Non-zero power ratios arising from measurements on a DUT of unknown $\Gamma$ could then be represented in terms of circles centred on the corresponding q points, circle radius being proportional to square root of power ratio. The point of intersection of the three circles yielded the radius vector representing the unknown reflection coefficient. Engen went on to describe a specific design of six-port reflectometer junction. This incorporated five four-port directional couplers (quadrature hybrids) and five lengths of waveguide, and gave broadband performance for appropriate lengths of waveguide. However, it is a major disadvantage that this design cannot be constructed in coplanar form, with many commercially available waveguide components.

In the Proceedings of the 11th European Microwave Conference, pp 501–506, 1980 (Reference 2), Hansonn et al provided a reflectometer design comprising a directional coupler connecting a source to a symmetrical five-port junction. This junction is not a commercially available broadband device, and the reflectometer as a whole is at best operative over only a one octave bandwidth for a specific circuit configuration. Its properties are analysed by Dong et al in IEEE Trans., MTT-32, No. 1, pp 51–57, Jan 1984. For some arrangements, it is capable of single frequency operation only.

In Electronics Letters, 18, pp 491∝493, June 1982 (Reference 3), E J Griffin describes a third six-port reflectometer design incorporating commercially available components, unlike Reference 2. Moreover, this design is much simpler than that of Reference 1, in that only three couplers and two lengths of waveguide are employed. Provided that the phase velocities in the waveguides and couplers are equal, and that appropriate lengths of waveguide are employed, this design is operative over a one octave bandwidth.

Commonly assigned co-pending United Kingdom Patent Application No. 8311170 dated the 25th of April 1983 (Reference 4), on which is based U.S. application Ser. No. 601,448 filed Apr. 18, 1984, now U.S. Pat. No. 4,571,545 issued Feb. 18, 1986, relates to a further six-port reflectometer arrangement. It employs four four-port couplers and a length of waveguide. Three of the couplers provide a series power transmission path from the power source to a DUT. The fourth coupler is doubly connected to the second coupler, one connection being direct and the other via the waveguide, and has two other ports connected to respective detectors. The waveguide angular length is arranged to equalize input and reflected wave paths to the fourth coupler. This ensures that the waveguide has the bandwidth of its components, all of which may be broadband, provided that the phase velocities in the couplers and waveguide are equal. A further advantage is that of operability at low source power levels, $\sim 50\,\mu$W, which reduces costs and power absorbed in the DUT.

From the foregoing discussion, it will be seen that prior art six-port reflectometer arrangements have differing advantages and disadvantages. More generally, the design criteria are as follows:

(1) minimum measurement uncertainty;

(2) minimum microwave source power for low costs;

(3) minimum power incident on a matched load to minimize dissipation in sensitive devices;

(4) Implementation in commercilally available components to minimize costs (eg rectangular waveguide, image and dielectric waveguides, microstrip integrated circuits);

(5) minimize number of components to minimize departure from theoretical performance (components are always non-ideal with frequency dependent parameters);

(6) planar construction for implementation in a variety of transmission media;

(7) operational independence of any requirement for equality of phase velocities in couplers and any interconnecting waveguides; and (8) maximum dynamic range for measuring DUT parameters.

In Table 1, some of the prior art design parameters are compared for ease of reference.

TABLE 1

| Design Implementation | | Reference 1 | Reference 2 | Reference 3 | Reference 4 |
|---|---|---|---|---|---|
| Coplanar Construction | Rectangular Waveguide | No | Yes, but single frequency only | Yes | Yes |
| | Microstrip | Yes | Yes | Yes | No |
| | Image/ Dielectric Waveguide | No | Unknown | Yes | No |
| Commercially available components | | No | No | Yes | Yes |
| Broadband | | Yes | Single frequency normally, One octave maximum | Yes | Yes |
| Independence of Equality of Phase Velocity in Couplers and Waveguide | | Yes | Yes | No | No |
| Number of Couplers | | 5 x four-port | 1 three-port 1 five- | 3 x four-port | 4 x four-port |

TABLE 1-continued

| Design | Reference | | | |
|---|---|---|---|---|
| Implementation | 1 | 2 | 3 | 4 |
| | | | port | |

It is an object of the present invention to provide an alternative form of six-port reflectometer.

The present invention provides a six-port reflectometer including first and second directional couplers, a first waveguide and a third directional coupler arranged to provide a series path for transmission of input radiation from a first coupler source connection port to a third coupler load connection port, and wherein:

(1) the first coupler is connected to first and second detectors, (2) the second coupler is connected to a third detector and to a fourth directional coupler having two ports connected by a second waveguide and a further port connected to an absorber, and (3) the third coupler is connected to a reflector and to a fourth detector.

The invention provides the advantage that it is easily configurable to minimize frequency dependence, as will be described.

In a preferred embodiment, the invention is arranged such that (1) the second waveguide and the reflector are connected to receive input radiation coupled thereto by the second and third couplers respectively, (2) the third and fourth couplers provide substantially equivalent transmission paths, and (3) the length of the second waveguide is arranged to produce path length equality for signals leaving the second coupler and returning to it from the reflector and from the fourth coupler/second waveguide arrangement respectively.

In this embodiment, variation of signal samples reaching detectors due to relative variation between phase velocities in couplers and waveguides is avoided. This obviates a major source of reflectometer frequency dependence, and ensures that broadband performance is obtainable in the absence of appreciable change in other reflectometer component parameters, unlike References 3 and 4. Furthermore, the invention may be constructed in coplanar form from commercially available components, unlike References 1 and 2.

The reflector and absorber may be wholly reflecting and wholly absorbing respectively. The invention may be constructed in rectangular waveguide, microstrip, image or dielectric waveguide. Commercially available lumped constant couplers may also be employed, and in this form the invention gives broadband performance, unlike References 2, 3 and 4.

The invention may be constructed entirely of 3 dB couplers.

In order that the invention might be more fully understood, embodiments thereof will now be described by way of example only, with reference to the accompanying drawings, in which.

Figure 1:
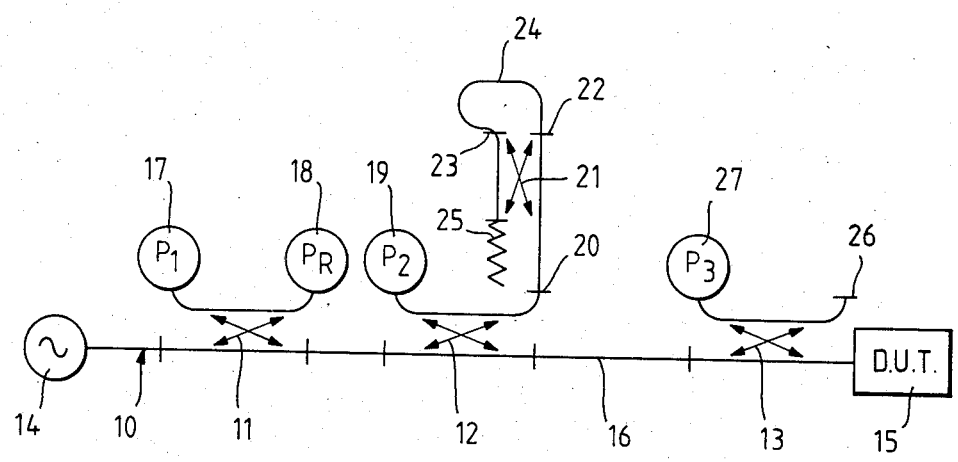
FIG. 1 is a schematic drawing of a generalized reflectometer of the invention.

Referring to FIG. 1, there is schematically shown a reflectometer indicated generally by 10. The reflectometer 10 includes first, second and third four-port 3 dB forward directional couplers 11, 12 and 13. Each coupler is indicated functionally by a pair of crossed arrows. A microwave source 14 supplies power to an unknown load 15 via the couplers 11 to 13 and a first waveguide 16 connecting couplers 12 and 13. Two square-law power detectors 17 and 18 are connected to the first coupler 11 to sample power input from the source 14 and that reflected from the load 15. Input power detector 18 is referred to as the reference detector. The second coupler 12 is connected to a third square-law power detector 19 and to an input port 20 of a fourth 3 dB forward directional coupler 21. Two ports 22 and 23 of the fourth coupler 21 are connected by a second waveguide 24 having an angular length twice that of the first waveguide 16. A matched load or absorber 25 is connected to the remaining port of the fourth coupler 21. The third coupler 13 has its remaining ports connected to a short circuit or reflector 26 and a fourth square-law power detector 27.

Input microwave power from the source 14 is partly forward coupled to the reference detector 18, and partly transmitted to the second coupler 12. Power received by the second coupler 12 is partly coupled to the fourth coupler 21, and partly transmitted via waveguide 16 to the third coupler 13. The load 15 and short circuit 26 receive and reflect power transmitted and coupled respectively thereto by the third coupler 13. The fourth detector 27 receives a combination of power coupled and transmitted to it after reflection at the short circuit 26 and the load 15 respectively. Power reflected by the short circuit 26 and load 15 and respectively coupled and transmitted by the third coupler 13 returns via the first waveguide 16 to the second coupler 12, where it is partly coupled to the third detector 19.

The third detector 19 also receives a sample of input power originally coupled to the fourth coupler 21 and effectively reflected as follows. Incident power reaching port 20 is both transmitted to port 22 and coupled to port 23. In addition, power reaching port 23 via the second waveguide 24 is both coupled to port 20 and transmitted to the matched load 25. Power returning via the waveguide 24 to port 22 is transmitted to port 20 and coupled to the matched load. By performing a vector sum of the various amplitude contributions, the combination of coupler 21, waveguide 24 and load 25 can be shown to act as a reflector having an effective reflection coefficient calculable from the coupler's transmission and coupling parameters. The reflection coefficient is $j2c_4t_4e^{-ja}$, where $t_4$ and $c_4$ are the fourth coupler's transmission and coupling parameters, a is the length of the second waveguide 24 and $j=\sqrt{-1}$.

Power reflected by the fourth coupler 21 is partly transmitted by the second coupler 12 to the third detector 19, and partly coupled to the first coupler 11. The second coupler 12 also transmits power from the first waveguide 16 to the first coupler 11. The detector 17 receives power coupled to it by the first coupler from that received from the second coupler 12.

The foregoing qualitative description demonstrates that the detectors 18, 19 and 27 receive differing combinations of unreflected power input to the reflectometer 10 and that reflected by the unknown load or DUT 15. The reference detector 18 receives only a proportion of input power. This is of course based on the theoretical assumption that all components are ideal. In practice, to compensate for non-ideal components, reflectoneters are calibrated against standards having accurately known reflection coefficients in a manner well-known in the art of microwave measurements. In particular, directional couplers have somewhat frequency dependent properties, and calibration enables this to be allowed for.

If the powers measured by detectors 17, 18, 19 and 27 are respectively $P_1$, $P_R$, $P_2$ and $P_3$, then elementary circuit analysis of the FIG. 1 arrangement indicates that:

$$\frac{P_1}{P_R} = t_1^2 t_2^4 t_3^4 \left| \Gamma + \frac{c_3^2}{t_3^2} - j \frac{2 c_2^2 c_4 t_4}{t_2^2 t_3^2} e^{j(2\beta - \alpha)} \right|^2 \quad (1)$$

$$\frac{P_2}{P_R} = c_2^2 \left( \frac{t_1}{c_1} \right)^2 t_2^2 t_3^4 \left| \Gamma + \frac{c_3^2}{t_3^2} + j \frac{2 c_4 t_4}{t_3^2} e^{j(2\beta - \alpha)} \right|^2 \quad (2)$$

$$\frac{P_3}{P_R} = c_3^2 \left( \frac{t_1}{c_1} \right)^2 t_2^2 t_3^2 |\Gamma - 1|^2 \quad (3)$$

where $c_n$, $t_n$ are the transmission and coupling coefficients of the nth coupler (n=1 to 4), and $\alpha$ and $\beta$ are the respective angular lengths of waveguides 24 and 16.

Equations (1), (2) and (3) define circles centered on the zero power points $q_1$, $q_2$, $q_3$.

With $\alpha = 2\beta$, $c_n = t_n = 1\sqrt{2}$ for n=1 to 4 (3 dB couplers) and all other connections to couplers being of zero length, Equations (1), (2) and (3) reduce to:

$$\frac{P_1}{P_R} = \frac{1^*}{32} |\Gamma + 1 - 2j|^2 \quad (4)$$

$$\frac{P_2}{P_R} = \frac{1}{16} |\Gamma + 1 + 2j|^2 \quad (5)$$

$$\frac{P_3}{P_R} = \frac{1}{8} |\Gamma - 1|^2 \quad (6)$$

Figure 2:
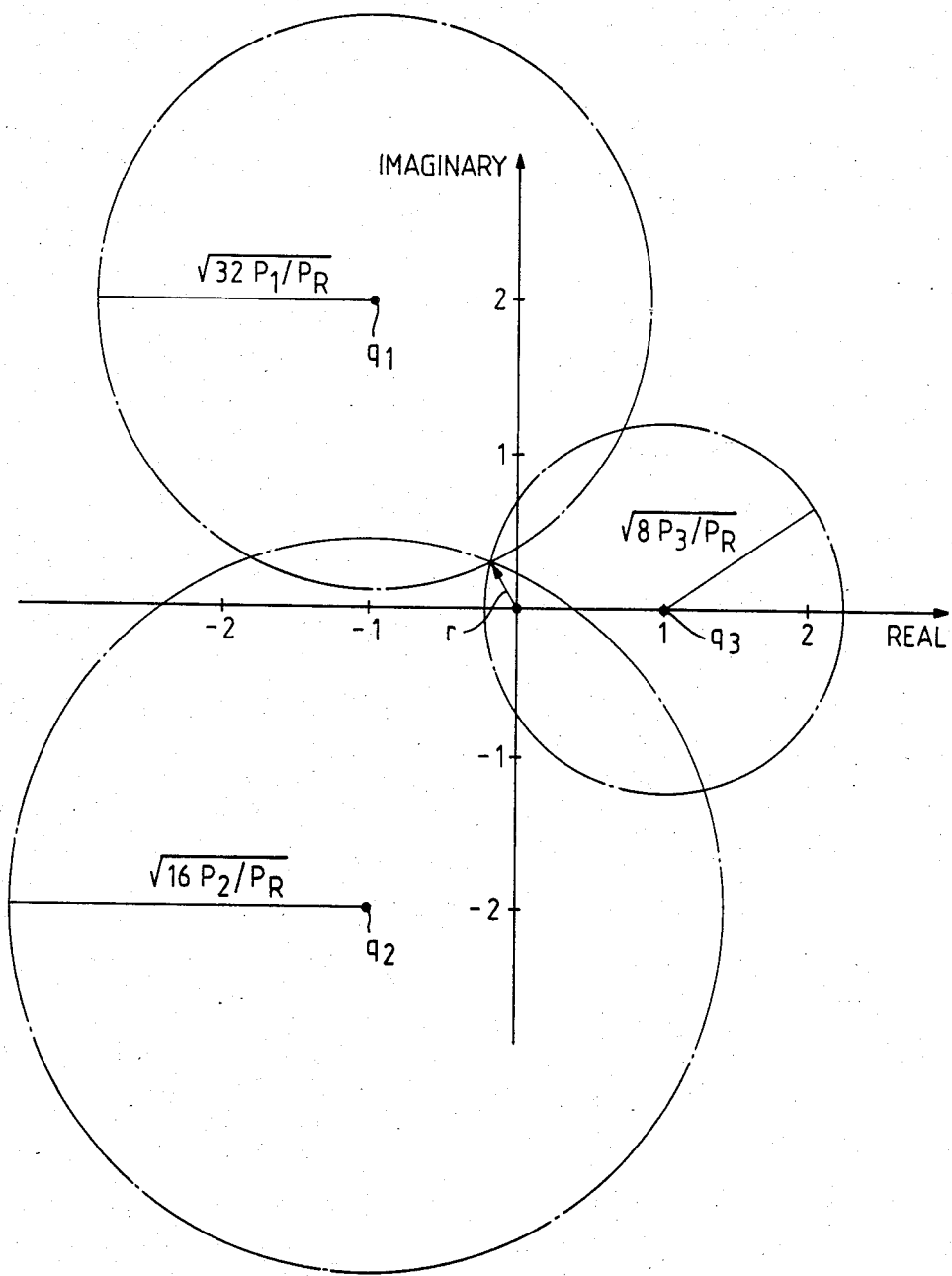
FIG. 2 illustrates the complex plane for reflection coefficient determination.

As illustrated in FIG. 2, Equations (4) to (6) respectively represent circles of radii $\sqrt{32 P_1/P_R}$, $\sqrt{16 P_2/P_R}$ and $\sqrt{8 P_3/P_R}$ centered at the points $(-1, 2j)$, $(-1, -2j)$ and $(1, j0)$ or $q_1$, $q_2$ and $q_3$ in the complex plane. The relative orientation of these points remains constant and frequency independent to the extent that the characteristics of couplers 12, 13 and 21 remain constant.

The criterion $\alpha = 2\beta$ ensures that radiation leaving coupler 12 and effectively reflected back from the combination of coupler 21 and waveguide 24 traverses an equal angular length of waveguide to that leaving and returning to the second coupler 12 via coupler 13 and short circuit or reflector 26. Moreover, both radiation paths involve traversal of a respective coupler twice. Since couplers 13 and 21 are equivalent, both radiation paths are equivalent. This is independent of relative phase velocities in couplers and waveguides and corresponding frequency dependence. Accordingly, the detected combinations of input radiation and radiation reflected from the DUT 15 do not have frequency-dependent relative proportions, provided that other component characteristics remain constant. These criteria if satisfied produce broadband performance.

a waveguide of angular length $\phi$, instead of direct connection, the relative positions of $q_1$, $q_2$ and $q_3$ are unaffected. These positions are merely rotated by equal amounts or phase angles in the complex plane. However, phase is not defined until the reflectometer is calibrated against devices having known reflection coefficients, which effectively calibrates out the phase change $\phi$ introduced by the waveguide.

Figure 3:
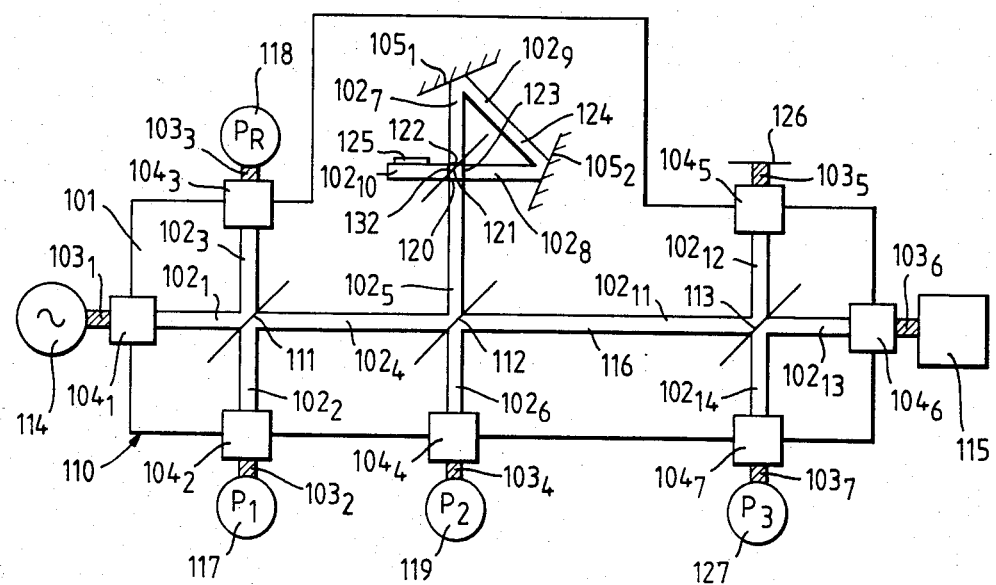
FIG. 3 is a drawing (not to scale) of an image guide implementation of the invention.

Referring now to FIG. 3, there is shown a schematic plan view of an image guide implementation of the invention, and parts equivalent to those shown in FIG. 1 are like-referenced with the prefix 100.

The image guide reflectometer is indicated generally by 110. It comprises an aluminium plate 101 5 mm thick on which cross-linked polystyrene image guide 102 is mounted in sections $102_1$ to $102_{14}$. The image guide 102 has a width of 4.8 mm and a depth of 2.4 mm. A source 114 of frequency 35 GHz supplies microwave power to the image guide section 102, via a rectangular waveguide and waveguide/image guide transformer. These are of known construction, and are indicated by $103_1$ and $104_1$ respectively. Microwaves pass via section $102_1$ to first coupler 111 having associated measuring and reference detectors 117 and 118 connected via image guide portions $102_2$ and $102_3$, transformers $104_2$ and $104_3$ and rectangular waveguides $103_2$ and $103_3$ respectively. Microwaves transmitted by the first coupler 111 pass via image guide section $102_4$ to the second coupler 112, to which the fourth coupler 121 is connected via inage guide section $102_5$. The second coupler 112 is also connected to the third detector 119 via guide section $102_6$, transformer $104_4$ and waveguide $103_4$.

The fourth coupler 121 has four ports as indicated approximately at 120, 122, 123 and 132. Ports 122 and 123 are connected by a waveguide indicated generally by 124 and comprising three image guide sections $102_7$ to $102_9$. Microwaves are reflected between adjacent guide sections by polished metal mirrors $105_1$ and $105_2$. Port 132 is connected to a matched load in the form of a right triangular aluminium plate 125 alongside an image guide section $102_{10}$. The plane of the plate and one shorter side are upright, ie extend out of the plane of the drawing. Its other shorter side is attached to the guide mounting plate 101, and the upright shorter side is remote from the coupler 121. The effect of this is that microwaves from the coupler 121 are progressively absorbed by the plate 125 as they pass along guide section $102_{10}$.

The second coupler 112 is connected via waveguide 116 (ie image guide section $102_{11}$) to the third coupler 113. A variable short circuit 126, DUT or load 115 and detector 127 are connected to the coupler 113 via respective rectangular waveguides $103_5$ to $103_7$, transformers $104_5$ to $104_7$ and image guide sections $102_{12}$ to $102_{14}$.

Figure 4:
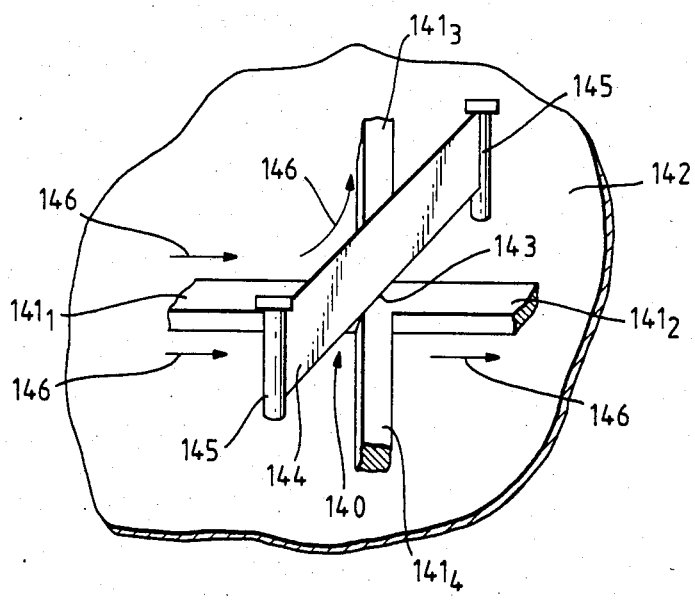
FIG. 4 is an enlarged view of a directional coupler of the kind employed in the FIG. 3 embodiment.

Referring now also to FIG. 4, there is shown an enlarged perspective view of an image guide forward directional coupler indicated generally by 140. The coupler 140 shows in more detail the form of couplers 111, 112, 113 and 121 of FIG. 3. Image guide portions $141_1$ to $141_4$ are mounted on an aluminium plate 142, and intersect at right angles at 143. The coupler 140 consists of a copper strip 144 mounted over the intersection 143 at 45° to each of the guide portions $141_1$ to $141_4$. The copper strip 144 has dimensions 50 mm × 15 mm × 0.1 mm, these dimensions extending respectively parallel, perpendicular and parallel to the plate 142. Slotted posts 145 mounted on the plate 142 retain the strip 144 engaged in the slots (not shown).

The coupler 140 operates broadly speaking as follows. Electromagnetic waves travelling in for example guide portion $141_1$ are partially transmitted and partially reflected by the coupler 140 to guide portions $141_2$ and $141_3$ respectively, as indicated by arrows 146. The copper strip 144 effects wavefront division of electromagnetic waves. The coupler 140 extends over a larger region than that covered by the strip 144. Electromagnetic waves closer to the strip than a distance of the order of one wavelength change to evanescent modes. This effect is well-known in the art. Where waveguide lengths are important, eg waveguides 24 and 16 or 124 and 116, it is necessary to allow for effective coupler dimensions.

As has been said, to obtain broadband performance it is important to produce path length equality for signals returning to the second coupler from the short circuit and from the coupler/waveguide combination. In the embodiment of FIG. 1, this was achieved by making the angular length of singly-traversed waveguide 24 equal to twice that of doubly-traversed waveguide 16, ie $\alpha = 2\beta$. This is sufficient to meet the equality criterion provided that there are direct connection between coupler 12 and waveguide 24 and between coupler 13 and short circuit 26. However, in the FIG. 3 embodiment, coupler 124 and short circuit 126 are connected by respective image guide sections $102_5$ and $102_{12}$ to the respective couplers 112 and 113. The path length equality criterion now becomes:

$$\alpha + 2\gamma = 2\beta + 2\delta$$

where $\alpha$, $\beta$ and $\gamma$ are the angular lengths of image waveguides 124, $(102_7 + 102_8 + 102_9)$, 116 ($102_{11}$) and $102_5$, and $\delta$ is the angular length of image guide $102_{12}$ together with its associated transformer $104_5$ and rectangular waveguide $103_5$.

An enbodiment of the invention similar to that described with reference to FIGS. 3 and 4 has been operated successfully at 35 GHz and 36 GHz.

A further embodiment of the invention has been constructed of commercially available so-called lumped constant couplers with coaxial transmission line interconnections. The couplers are four-port devices having internal connections via impedances appropriate to provide 3 dB transmission and coupling properties. This embodiment has been calibrated and used successfully over the band 10 MHz to 200 MHz (4.3 octaves) without requiring adjustment after initial setting up. In this connection, as has been mentioned previously, some prior art devices are limited to single frequency or one octave operation unless components are either changed or readjusted. The use of lumped constant couplers is well-known in the art and will not be described.

A dielectric guide embodiment of the invention has also been produced in a form very similar to that shown in FIGS. 3 and 4. This embodiment employs dielectric guide with a cross-section of 2.54 mm by 1.27 mm and formed of cross-linked polystyrene. Coupler strips are 10 mm square with a thickness of 0.36 mm, and are of high dielectric constant cross-linked polystyrene. These replace metal couplers illustrated in FIGS. 3 and 4. The aluminium plate 101 is replaced by an expanded polystyrene support and short circuit 126 by a metal nirror. Transformer 104 are implemented by microwave horns into which the dielectric guides taper. The embodiment is mounted within an aluminium box having walls on which the microwave horns are mounted. This arrangement has been successfully operated over the 77 GHz to 105 GHz band. It is considered that the width of this operating band could be extended by minor technical improvements such as designing mirrors (cf 105) to avoid frequency-dependent reflection.

We claim:

1. A six-port reflectometer including first, second and third directional couplers arranged to provide a series path for transmission of input radiation from a source to a load, and wherein:
   (a) the first coupler is connected to first and second detectors;
   (b) the second coupler is connected to the third directional coupler via a first waveguide and is also connected to a third detector and a fourth directional coupler;
   (c) the fourth coupler has two ports connected together by a second waveguide and a further port connected to an absorber; and
   (d) the third coupler is connected to a reflector and to a fourth detector.

2. A reflectometer according to claim 1 wherein:
   (a) the second waveguide and the reflector are connected to receive input radiation coupled thereto by the second and third couplers respectively;
   (b) the third and fourth couplers provide substantially equivalent transmission paths; and
   (c) the length of the second waveguide is arranged to produce substantial path length equality for signals leaving the second coupler and returning to it from the reflector and from the fourth coupler/second waveguide combination respectively.

3. A reflectometer according to claim 2 wherein the first, second, third and fourth couplers and the first and second waveguides are each dividable into two substantially mirror image parts by a common plane.

4. A reflectometer according to claim 2 wherein the reflector and absorber are respectively substantially fully reflecting and fully absorbing.

5. A reflectometer according to claim 2 wherein the first, second, third and fourth couplers have 3 dB transmission and coupling properties.

* * * * *